United States Patent [19]

Burrage

[11] 4,020,418
[45] Apr. 26, 1977

[54] APPARATUS FOR GENERATING A DIGITAL COUNT PROPORTIONAL TO AN INPUT FREQUENCY

[75] Inventor: Robert Graham Burrage, Solihull, England

[73] Assignee: Lucas Industries Limited, Birmingham, England

[22] Filed: Nov. 14, 1975

[21] Appl. No.: 632,001

[30] Foreign Application Priority Data
Nov. 21, 1974 United Kingdom ............ 50453/74

[52] U.S. Cl. .......................... 324/78 D; 324/79 D; 307/269
[51] Int. Cl.$^2$ ....................................... G01R 23/02
[58] Field of Search ............ 324/187, 78 D, 77 D, 324/79 D, 83 D, 166, 186; 235/194; 307/269

[56] References Cited
UNITED STATES PATENTS 3,930,199  12/1975  Valis ............................. 324/78 D Primary Examiner—Rudolph V. Rolinec
Assistant Examiner—Michael J. Tokar

[57] ABSTRACT

An apparatus for generating a digital count proportional to the frequency of a pulsed input signal has two binary rate multipliers both of which provide output frequency signals dependent on the instantaneous count in a counter. A first one of the multipliers is responsive to a fixed input frequency and the second multiplier is dependent on the output frequency of the first multiplier. The value in the counter is decremented from an initially-set maximum by the output of the second multiplier. The apparatus is operated for a time dependent on the cycle time of the unknown pulsed input frequency. Decrementation of the count is inversely proportional to time. The count is thereby directly proportional to the unknown frequency.

12 Claims, 4 Drawing Figures

APPARATUS FOR GENERATING A DIGITAL COUNT PROPORTIONAL TO AN INPUT FREQUENCY

This invention relates to apparatus for generating a digital count which is proportional to the frequency of a pulsed electrical input signal.

An apparatus according to the invention comprises means for generating a reference signal of a known frequency, a digital counter, two binary rate multipliers each of which is connected to receive the count in said counter as a first signal, a first one of said multipliers having said reference signal as a second input signal and a second one of said multipliers having the output signal from said first multiplier as a second input signal, said second multiplier being responsive to its first and second input signal to provide a first output signal and being connected to said counter so that the count therein can be altered in response to said first output signal, and control means, responsive to predetermined points in a cycle of said pulsed input signal, for causing said count to be so altered and for arresting the alteration of said count.

Figure 1:
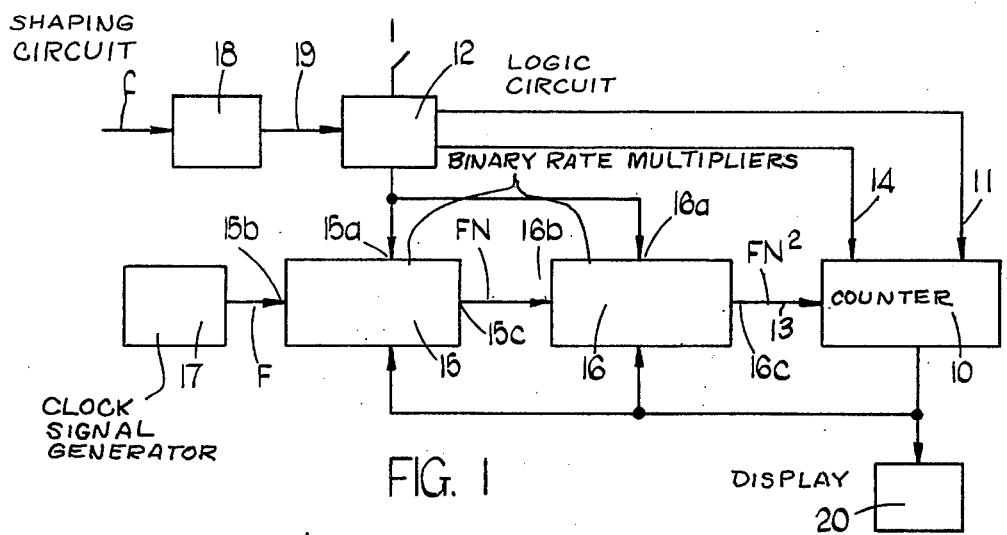
Figure 2:
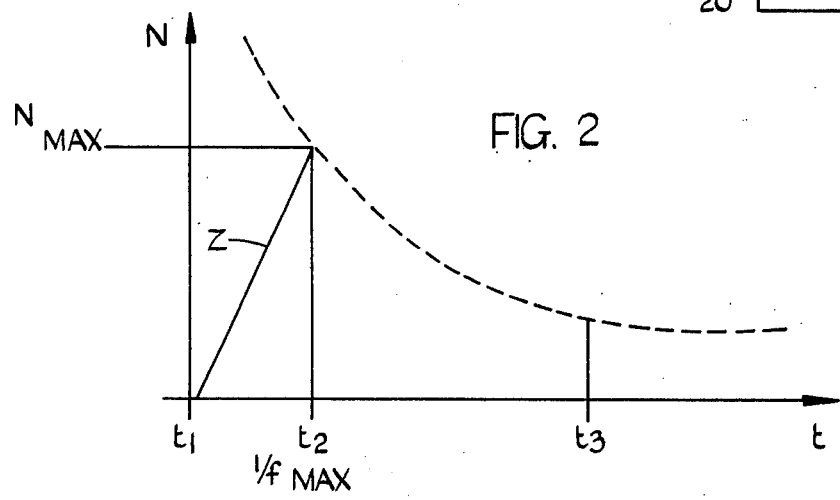
Figure 3:
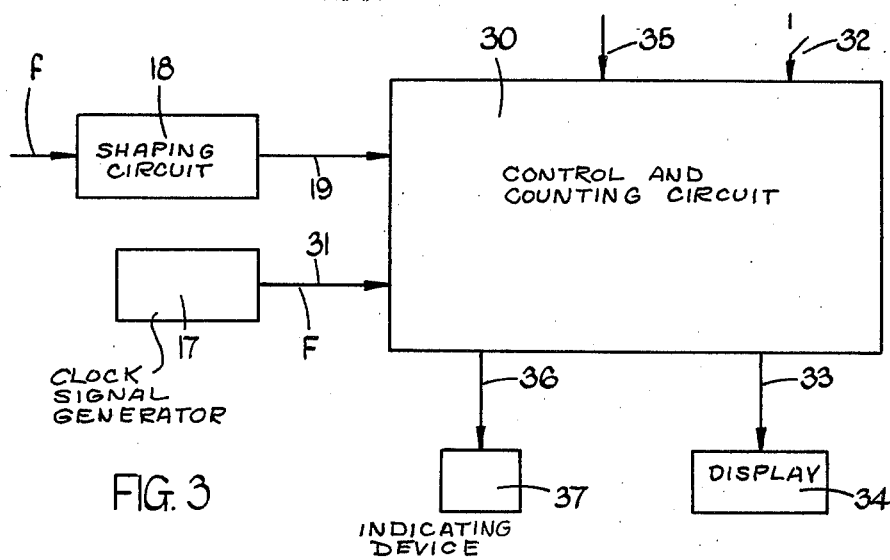
Figure 4:
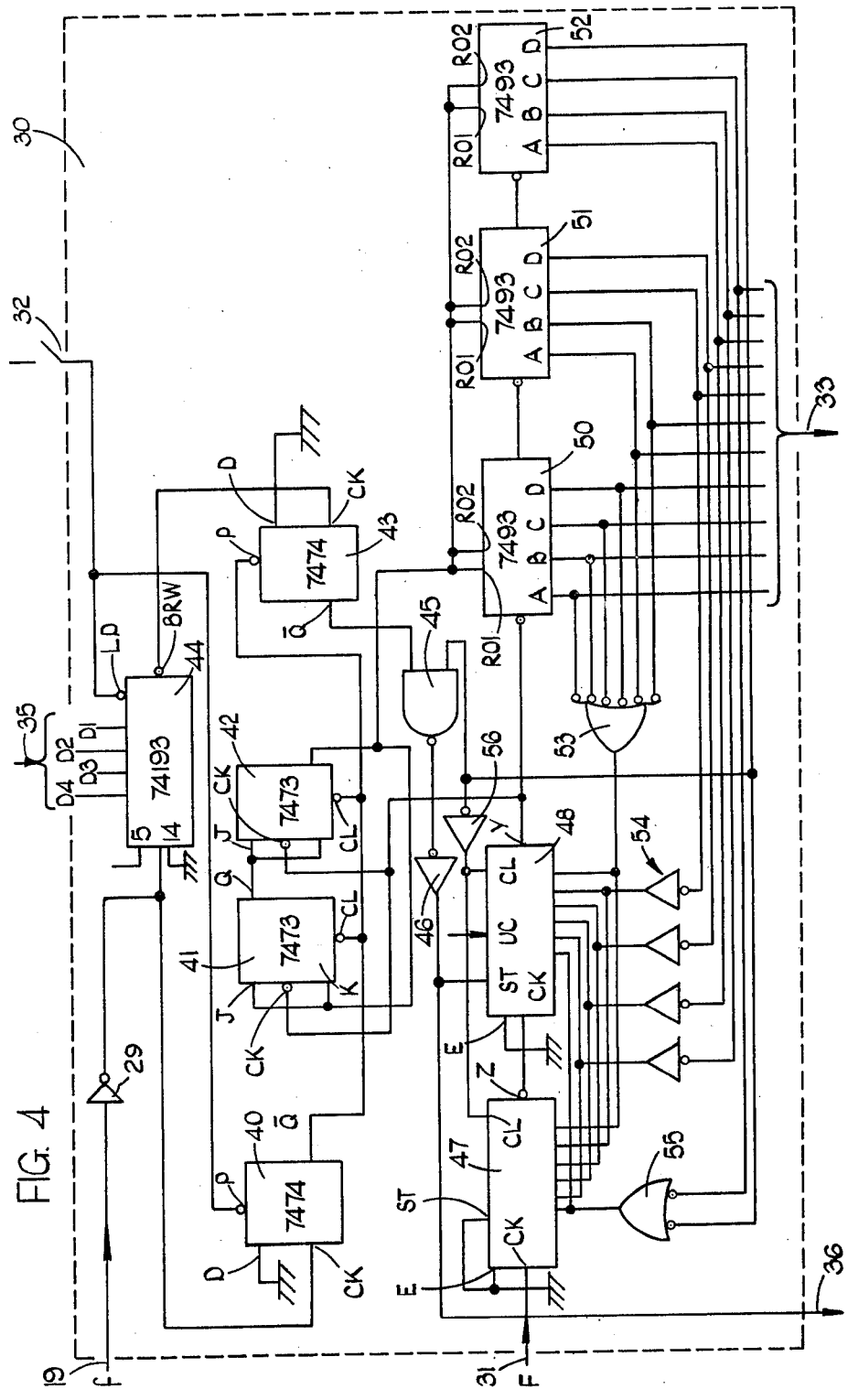

The invention will now be described with reference to the accompanying drawings, in which:

FIG. 1 is a diagram of an apparatus illustrating the principle of the invention, FIG. 2 shows a curve of the count magnitude against time, FIG. 3 is a block diagram of an example of an apparatus according to the invention, and FIG. 4 shows details of a part of the apparatus of FIG. 3.

The apparatus shown in FIG. 1 has a digital counter 10 the count N in which can be set to a maximum value in response to a signal on a line 11 from a control logic circuit 12. The count N in counter 10 can be decremented in response to a series of pulses on a line 13. Counter 10 is rendered responsive to the pulses on line 13 by a control signal on a line 14, also from the control circuit 12.

There is provided a pair of type SN7497 binary rate multiplier devices 15, 16. Each of the devices 15, 16 can provide at its output a pulse train of a frequency which is the product of a binary valve applied to a first input and the frequency of a pulse train which is applied to a second input. The binary value applied to the first inputs 15a, 16a of the devices 15, 16 is the count N in counter 10, this count N being applied by the commonly-known parallel loading technique. A clock signal F of a known frequency is generated by a circuit 17 and is applied to the second input 15b of multiplier 15. The signal at the output 15c of multiplier 15 is thus a pulse train whose frequency is a product FN of the frequency of signal F and the value N in counter 10.

The output pulse train from multiplier 15 is applied to the second input 16b of multiplier 16. The signal at output 16c of multiplier 16 is thus a pulse train whose frequency is $FN^2$. This signal is applied via line 13 to counter 10 to decrement the count therein. Since decrementation of the count N is at a rate which is dependent on the instantaneous value of $N^2$:

then $\delta N = -\delta k F N^2 t$ (1)

whereby, as shown in FIG. 2, N changes asymptotically with time $t$.

The control circuit 12 is also responsive to an alternating input signal whose frequency $f$ is to be measured. The input signal is preferably applied via a shaping circuit 18 and the resultant square waveform supplied to circuit 12 on a line 19.

Operation of the apparatus, later to be described in detail, is initiated at a time $t_1$ by a positive-going edge of the signal on line 19. Decrementation of the count in counter 10 is stopped by the next succeeding positive-going edge at a time $t_3$. The count N is displayed by a suitable device 20.

As indicated in FIG. 2, at high values of input frequency $f$, the initial value N required to be set in the counter 10 would be unacceptably large. It is arranged, therefore, that decrementation of the count in counter 10 is delayed, after time $t_1$, until a second time $t_2$, this delay being dependent on the maximum value $f_{max}$ of the input frequency $f$ which can be measured by the apparatus, that is, effectively, the highest value $N_{max}$ of the count N which can be stored in counter 10.

From (1) $1/n^2 \, \delta N = -kF\delta t$ (2)

for an input frequency $f$, the count N in counter 10 changes from $N_{max}$ to $N_f$ between time $t_2$ and time $t_3$ therefore from (2) $\int_{N_f}^{N_{max}} 1/N_2 dN = -kF \int_{t_2-t_1}^{t_3-t_1} dt$ (3)

but $t_3-t_1 = 1/f$ and $t_2-t_1 = 1/f\,max$
whence $1/N_{max} - 1/N = -kF/f + kF/f_{max}$ (4)

It can be arranged that
when $f = f_{max}/2$
then $N = N_{max}/2$
then $1/N_{max} = kF/f_{max}$ $\therefore k = f_{max}/FN_{max}$ (5)

from (4) and (5)

$N/N_{max} = f/f_{max}$ (6)

$1/f_{max} = t_2-t_1 = N_{t_1-t_2}/F$ (7)

substitute in (6) $F.N_{max}.N_{t_2-t_1}/F$ (8)

Equation (8) gives the relationship between the variables associated with the apparatus described.

The apparatus shown in FIG. 3 has a control and counting circuit 30, shown in more detail in FIG. 4. Circuit 30 is responsive to the square waveform on line 19 from shaping circuit 18, previously referred to. Circuit 30 is also responsive to the clock frequency signal F on a line 31 from the circuit 17, also previously referred to.

Operation of the circuit 30 may be initiated by a signal on a line 32, and the count which provides the output signal is supplied on a plurality of lines 33 to a display arrangement 34.

Circuit 30 includes a down-counter, later to be described, connected to provide a dividing function and responsive to the state of digital signals on a plurality of lines 35.

Finally, while engaged in a counting operation circuit 30 supplies a signal on a line 36 to a suitable indicating device 37.

As shown in FIG. 4 the square wave signal on line 19, and having input frequency $f$, is supplied to the clock terminal CK of a type SN7474 edge-triggered bistable device 40, the D terminal of which is connected to earth. This square waveform is supplied via an inverter 29, so that a positive-going edge on line 19 results in a negative-going edge at terminal CK of device 40. The $\overline{Q}$ terminal of device 40 is connected to the clear terminal CL of each of a pair of type SN7473 bistable devices 41, 42, and also to preset terminal P of a further type SN7474 bistable device 43. The preset terminal P of bistable device 40 is responsive to the sequence-initiating signal on line 32, this signal being a logical 0.

Input line 19 is connected to the B terminal of a type 74193 down-counter 44, connected to act as a dividing circuit. Counter 44 is responsive to a digital input signal on a selected one of four lines 35 to provide, at its Borrow terminal BRW, a signal which is either of frequency $f$ or has a selected value $f/2$, $f/4$ or $f/8$.

The counter 44 is rendered operational by the signal on line 32 applied to its load terminal LD. The BRW terminal of counter 44 is connected to the CK terminal of device 43, the D terminal of which is earthed. The $\overline{Q}$ terminal of device 43 is connected to one input terminal of a NAND gate 45. The output terminal of NAND gate 45 is connected via an inverter 46 to the line 36.

Two type SN7497, six-bit, binary rate multipliers 47, 48 are arranged so that the Z output terminal of multiplier 47 is connected to the clock terminal CK of multiplier 48. The clock terminal CK of multiplier 47 is connected to receive the clock frequency F on line 31. The strobe terminal ST and enable terminal E of multiplier 47 are connected to earth, as is the enable terminal E of multiplier 48. The strobe terminal ST of multiplier 48 is connected to the output terminal of inverter 46.

Three type SN7493 binary counters 50, 51, 52 are arranged so as to form a 12-bit counter arrangement responsive to pulses from the Y terminal of multiplier 48, and so that the most significant bit of the counter arrangement as a whole appears at terminal D of counter 52. The A, B, C and D terminals of counter 50 and the A and B terminals of counter 51 are connected via a low-input OR gate 53 to set the least significant bits of multipliers 47 and 48. The C and D terminals of counter 51 and the A and B terminals of counter 52 are connected via respective ones of four inverters 54 to set the bits of multipliers 47, 48 in ascending order of significance. The C and D terminals of counter 52 are connected via a low-input OR gate 55 to set the most significant bits of multipliers 47, 48. The A, B, C and D terminals of all the counters 50, 51, 52 are connected to respective ones of the output lines 33. Operation of OR gate 53 has the effect that the rate inputs to multipliers 47, 48 change every sixty fourth output pulse from terminal Y of multiplier 48. This provides a close approximation of the decrementation curve shown in FIG. 2.

The D terminal of counter 52 is connected to a second input terminal of the NAND gate 45 and via an inverter 56 to the clear terminals CL of multipliers 47 and 48. The D bit of counter 52 is used an an overflow bit, the remaining bits of the counter arrangement as a whole being used for frequency measurement, and defining $N_{max}$.

The Y terminal of multiplier 48 is connected to the clock terminals CK of both bistable devices 41, 42. The $\overline{Q}$ terminal of device 41 is connected to the J and K terminals of device 42. The Q terminal of device 42 is connected to both the J and K terminals of device 41, and also to the $R_{o(1)}$ and $R_{o(2)}$ terminals of each of the counters 50, 51, 52.

In use, assume that the clock frequency F is being supplied by circuit 17 on line 31, and that initially the signal on the lines 35 is such as to cause the frequency at terminal BRW of counter 44 to be equal to the frequency $f$. At time $t_1$ a low-level signal on line 32 renders counter 44 effective to transmit this frequency and also causes the $\overline{Q}$ output of device 40 to be set to 0. This causes the Q output of device 41 to be set to 0, the $\overline{Q}$ output of device 42 to be set to 1 and the $\overline{Q}$ output of device 43 to be set to 0. The 1 at the $\overline{Q}$ output of device 42 sets all of counters 50, 51 and 52 to zero, and maintains them in this state.

Both inputs to NAND gate 45 thus become 0, providing a 0 at the ST terminal of multiplier 48, and on the output line 36. The indicator device 37 is arranged to be responsive to this 0 signal to show that the apparatus is in operation.

The 0 at terminal D of counter 52 provides a 1 at the CL terminals of both multipliers 47, 48. In this condition the multipliers 47, 48 are not responsive to the rate inputs from counters 50, 51, 52, and the frequency of and output at terminal Y of multiplier 48 is equal to the clock frequency F.

The next subsequent positive-going edge at terminal CK of device 40 provides a high level output at the $\overline{Q}$ terminal, this high level being applied to the CL terminals of devices 41, 42, rendering these devices responsive to input signals at the J, K and CK terminals.

The first succeeding pulse at the Y terminal of multiplier 48 is applied to the CK terminals of devices 41, 42. This causes the Q output of device 41 to change to 0. The state of device 42 does not change, since its J output was at 0 when the pulse was applied to terminal CK. The second succeeding pulse at terminal Y of multiplier 48 causes the $\overline{Q}$ output of device 42 to change to 0, this 0 being applied to the $R_{o1}$ and $R_{o2}$ terminals of counters 50, 51, 52 to render them responsive to subsequent pulses at the Y output of multiplier 48. The response of counters 50, 51, 52 is thus delayed for the duration of two Y output pulses, and the count then increases at the clock frequency F on line 31, until the count reaches $N_{max}$ at time $t_2$. This increase in the count is indicated by line Z in FIG. 2. As described above the actual decrementation curve provided by the apparatus is an approximation of the ideal curve shown in FIG. 2. The delay of two pulses is necessary to take account of this approximation and to ensure that the count $N_{max}$ is reached at time $t_2$, and thereby corresponds with $1/f_{max}$.

When the value $N_{max}$ is reached, the D output of counter 52 is set to 1, applying a 0 to the CL terminals of multipliers 47, 48. The input signals to the clear CL, strobe ST and enable E terminals of both multipliers 47, 48 are all at a low level and the multipliers are then responsive to the rate signals from counters 50, 51, 52. The count in the counter arrangement as a whole then decrements in an approximation of the value $FN^2$, until time $t_3$ when the next positive-going edge at the BRW terminal of counter 44 causes the $\overline{Q}$ output of device 43 to become 1. Providing that the D output of counter 52 remains at 1, that is that the value in the remainder of the counter arrangement has not reached zero, the strobe input ST of multiplier 48 is set to 1, arresting operation of this multiplier. Decrementation of the value in the counter arrangement stops and the indicating device 37 shows that the sequence has been completed. The counter value may then be read on display device 34.

Should the input frequency $f$ be sufficiently high as to complete a cycle before time $t_2$, decrementation will not take place and the reading on the display device 37 will correspond to $f_{max}$. In such a case a selected one of the lines 35 is energised to cause the frequency signal at the BRW terminal of counter 44 to equal $f/2$. Further selection of values $f/4$ or $f/8$ may be necessary until a decremented reading is obtained from the counter arrangement.

I claim:

1. An apparatus for generating a digital count which is proportional to the frequency of a pulsed input signal, comprising means for generating a reference signal of a known frequency, a digital counter, two binary rate multipliers each of which is connected to receive the count in said counter as a first signal, a first one of said multipliers having said reference signal as a second input signal and a second one of said multipliers having the output signal from said first multiplier as a second input signal, said second multiplier being responsive to its first and second input signal to provide a first output signal and being connected to said counter so that the count therein can be altered in response to said first output signal, and control means, responsive to predetermined points in a cycle of said pulsed input signal, for causing said count to be so altered and for arresting the alteration of said count.

2. An apparatus as claimed in claim 1 in which said control means includes means for setting said count to a maximum value prior to application of said first output signal to said counter.

3. An apparatus as claimed in claim 1 which includes means for detecting a first one of said predetermined points of said pulsed input signal, and means for delaying, after operation of said detecting means, application of said first output signal by a period which is dependent on the capacity of said counter.

4. An apparatus as claimed in claim 3 in which said delay means includes means for rendering said multipliers non-responsive to the count in said counter, whereby said second multiplier provides a second output signal which has a fixed relationship to the frequency of said reference signal, said counter being responsive to said second output signal, and means responsive to a predetermined value in said counter for rendering said multipliers responsive to said count.

5. An apparatus as claimed in claim 4 in which said delay means includes means for varying the time of application of said second output signal to said counter by an amount which is dependent on a difference between the rate of change of said count in response to said first output signal and a rate of change proportional to the product of said reference frequency and the instantaneous value of said count.

6. An apparatus as claimed in claim 3 in which said detecting means includes a shaping circuit responsive to said pulsed input signal to generate a substantially square waveform, and means responsive to a first edge of said square waveform for generating a first control signal.

7. An apparatus as claimed in claim 6 which includes further detecting means responsive to a second edge of said square waveform for generating a second control signal.

8. An apparatus as claimed in claim 7 in which said means respectively responsive to said first and second edges, are responsive to edges having the same sense.

9. An apparatus as claimed in claim 7 which includes means for rendering the interval between said first and second edges a desired multiple of the interval of a cycle of said pulsed input signal.

10. An apparatus as claimed in claim 7 in which said further detecting means is rendered responsive to said second edge by said first control signal.

11. An apparatus as claimed in claim 7 which includes means for providing a visual indication during the interval between said first and second control signals.

12. An apparatus as claimed in claim 1 which includes means for providing a visual display of the count in said counter.

* * * * *